United States Patent [19]

Chou

[11] Patent Number: 5,308,415
[45] Date of Patent: May 3, 1994

[54] ENHANCING STEP COVERAGE BY CREATING A TAPERED PROFILE THROUGH THREE DIMENSIONAL RESIST PULL BACK

[75] Inventor: Erh-Nan Chou, Singapore, Singapore

[73] Assignee: Chartered Semiconductor Manufacturing PTE Ltd., Singapore, Singapore

[21] Appl. No.: 999,404

[22] Filed: Dec. 31, 1992

[51] Int. Cl.⁵ .................... H01L 21/31; H01L 21/312
[52] U.S. Cl. ................................. 156/643; 156/644; 156/651; 156/659.1; 437/947; 437/981
[58] Field of Search ............... 156/644, 659.1, 651, 156/643; 437/947, 981

[56] References Cited

U.S. PATENT DOCUMENTS

| | | |
|---|---|---|
| 4,372,034 | 2/1983 | Bohr . |
| 4,523,976 | 6/1985 | Bukhman ............... 156/643 |
| 4,764,245 | 8/1988 | Grewal ................... 156/651 |
| 4,814,041 | 3/1989 | Auda ...................... 156/643 |
| 4,824,767 | 4/1989 | Chambers et al. ...... 430/313 |
| 4,832,788 | 5/1989 | Nemiroff ................ 156/643 |
| 4,902,377 | 2/1990 | Berglund et al. ....... 156/644 |
| 4,908,333 | 3/1990 | Shimokawa ............ 437/195 |
| 4,980,316 | 12/1990 | Huebner ................ 437/228 |

FOREIGN PATENT DOCUMENTS

| | | | |
|---|---|---|---|
| 61-91948 | 5/1986 | Japan | 437/947 |
| 62-84520 | 4/1987 | Japan | 437/947 |
| 62-205628 | 9/1987 | Japan | 437/947 |
| 3-62554 | 3/1991 | Japan . | |

Primary Examiner—Brian E. Hearn
Assistant Examiner—Laura M. Holtzman
Attorney, Agent, or Firm—George O. Saile

[57] ABSTRACT

A new method of forming contact or via openings is achieved. A photoresist layer is formed and patterned top of layers of insulating materials overlying a semiconductor substrate. An isotropic etch is performed etching both vertically and horizontally a portion of the insulating layers. The photoresist is pulled back via a pure isotropic etch. Since the resist is being etched threedimensionally, an overhang resist profile is formed at the top of the opening. The opening is completed by anisotropically etching the remainder of the contact or via opening. The overhang part of the resist is recessed back gradually during etching. The oxide is exposed gradually through and together with the resist recessing back. The step formed after the first isotropic etch will be exposed to the anisotropic etch and will be etched into a slope.

15 Claims, 7 Drawing Sheets

ENHANCING STEP COVERAGE BY CREATING A TAPERED PROFILE THROUGH THREE DIMENSIONAL RESIST PULL BACK

BACKGROUND OF THE INVENTION (1) Field of the Invention

The invention relates to the manufacture of integrated circuits, and more particularly, to a process of creating a contact or via opening which allows for improved metal step coverage in the manufacture of integrated circuits.

(2) Description of the Prior Art

The problem of poor metal step coverage within a contact or via opening is an important one in the art. If the metal coating within the opening is too thin, it can cause the resistance within a contact opening to be too high for the circuit to work properly. Current practice calls for the formation of contact or via openings with stepped or sloped sides rather than vertical sides to improve the metal step coverage.

U.S. Pat. No. 4,372,034 to Bohr describes a wet anisotropic etch followed by a dry anisotropic etch, resulting in a "teacup" shape which is wide and sloping at the top and narrow at the bottom, as shown in FIG. 1A. This shape solves the step coverage problem at the top of the opening, but the problem still exists at the bottom. Another method in current practice is the resist pull technique in which a first etching creates a step in the oxide layer, then an oxygen plasma is used to pull back the resist exposing an oxide stair, as in FIG. 1B. Finally, an anisotropic etch chops the stair into a sloped pattern, as shown in FIG. 1C. One problem with this approach is fencing on the sidewall. That is, the first etching creates a polymer which remains on the sidewalls of the opening after the resist pull back step. This polymer acts as a resist mask to block the final anisotropic etch resulting in an oxide fence or shell within the opening. Another problem is the restriction of the resist pull back to 0.15 micrometers per side. This occurs since the etch rate for the resist is normally two times faster than the pull back to keep a margin of resist to prevent etching through to the oxide.

U.S. Pat. Nos. 4,814,041 to Auda, 4,824,767, to Chambers et al, 4,832,788 to Nemiroff, 4,908,333 to Shimokawa et al, and 4,980,316 to Huebner all describe various methods of forming contact openings.

SUMMARY OF THE INVENTION

A principal object of the present invention is to provide an effective and very manufacturable method of creating a contact or via opening which will allow for good metal step coverage.

Another object of the present invention is to provide a method of creating a contact or via opening with continuously tapered profiles.

Another object is to provide a method of forming contact or via openings which allow resist pull back up to 0.3 micrometers per side, thus enhancing the slope of the sides of the openings.

In accordance with the objects of this invention a new method of forming contact or via openings is achieved. A photoresist layer is formed and patterned on top of layers of insulating materials overlying a semiconductor substrate. An isotropic etch is performed etching both vertically and horizontally a portion of the insulating layers. The photoresist is pulled back via a pure isotropic etch. Since the resist is being etched three-dimensionally, an overhang resist profile is formed at the top of the opening. The opening is completed by anisotropically etching the remainder of the contact or via opening. The overhang part of the resist is recessed back gradually during etching. The oxide is exposed gradually through and together with the resist recessing back. The step formed after the first isotropic etch will be exposed to the anisotropic etch and will be etched into a slope.

BRIEF DESCRIPTION OF THE DRAWINGS

In the accompanying drawings forming a material part of this description, there is shown.

DESCRIPTION OF THE PREFERRED EMBODIMENTS

Figure 1A:
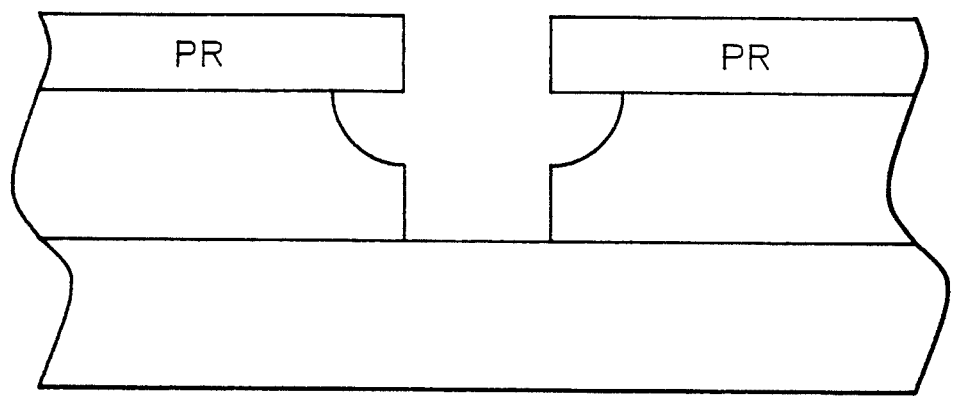
FIGS. 1A, 1B, and 1C schematically illustrate in cross-sectional representation prior art contact opening shapes.
Figure 1B:
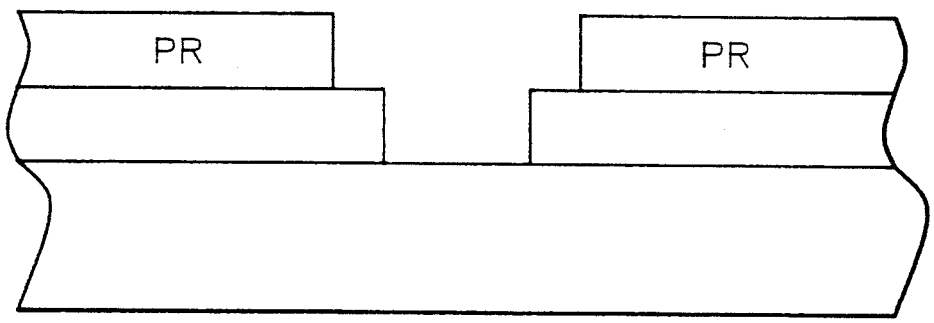
Figure 1C:
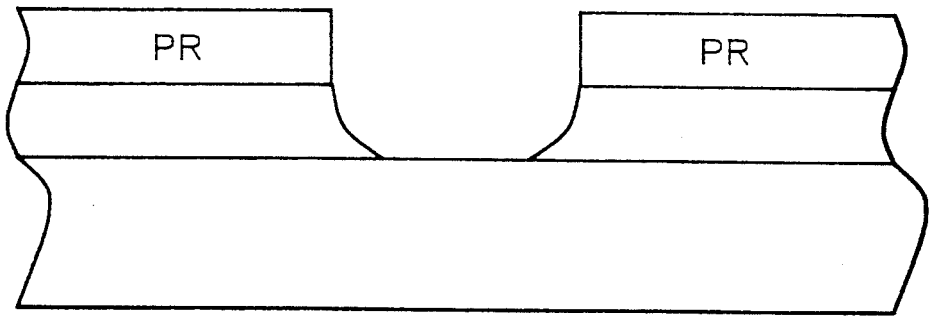
Figure 2:
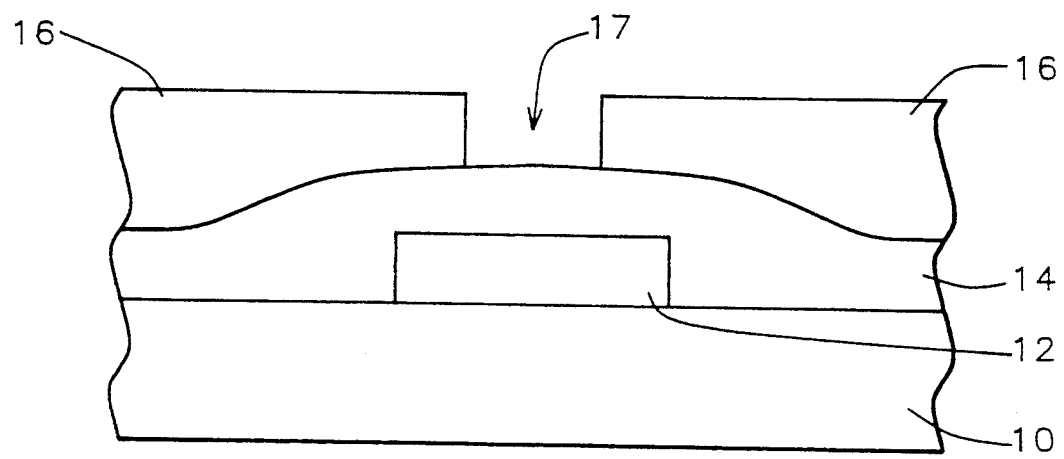
FIGS. 2 through 6 schematically illustrate in cross-sectional representation one preferred embodiment of this invention for a contact opening.

Referring now more particularly to FIG. 2, there is shown a portion of a partially completed integrated circuit. The semiconductor substrate 10 is preferably composed of monocrystalline silicon. An electrical contact will be made to a polysilicon or polycide layer 12. Overlying this layer 12 is an insulating layer 14 of oxide or borophosphosilicate glass (BPSG). This layer could be a multiple layer of, for example, BPSG overlying oxide. Photoresist layer 16 is formed on top of insulating layer 14. It is patterned as is conventional in the art to provide opening 17.

Figure 3:
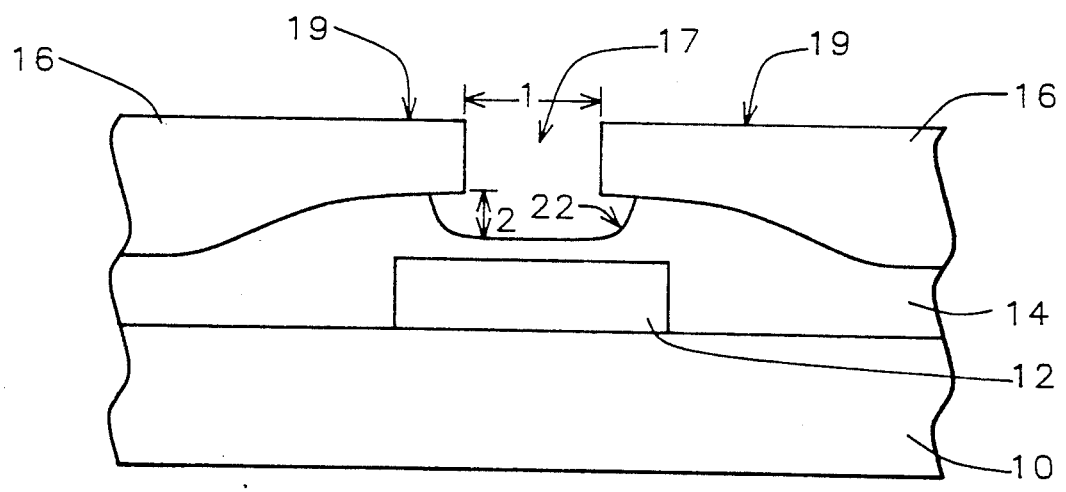

An isotropic etch is performed which will etch both horizontally and vertically the layer 14, undercutting the photoresist layer 16 as shown in FIG. 3. For a contact or via opening of about 0.8 micrometers in size (1), the vertical dimension (2) of the etching will be about 3000 to 4000 Angstroms. The horizontal dimension of the etching will be between about 3500 to 4500 Angstroms. The sidewalls 22 of the etched out opening are smooth tapered surfaces.

This isotropic etch may be performed in a downstream etcher such as a Matrix 403 made by Matrix Integrated systems, Inc. under the conditions: $NF_3$ gas flowing at 45 sccm. On gas flowing at 40 sccm, power of 370 watts, and pressure of 1 torr.

Figure 12:
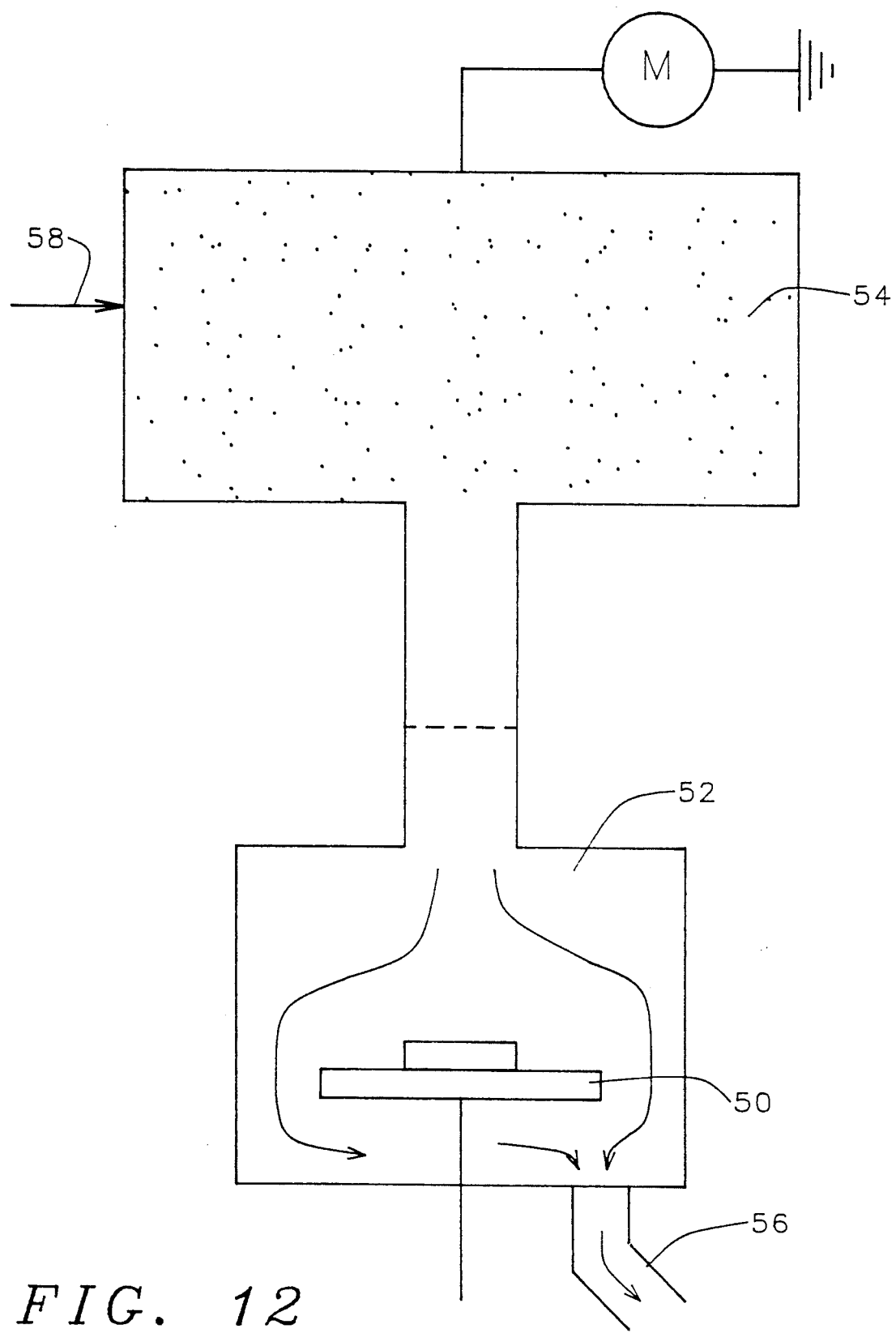
FIG. 12 schematically illustrates in cross-sectional representation an isotropic etcher.

Now the critical resist pull back process will be described. FIG. 12 illustrates an etcher such as the Matrix 403. The wafer 50 is positioned in the lower chamber 52 of the etcher. Oxygen plasma is created in the upper chamber 54 through oxygen flow in pipe 58 at a flow rate of about 20 to 40 sccm. A vacuum pump (not shown) draws the oxygen through perforated ring between chambers 54 and 52 and past the wafer into pipe 56. Pressure is maintained at between 500 to 1000 torr and power is at 30 to 60 watts. In other processes, the wafer 50 would be immersed in the plasma, that is, within the top chamber 54. Through the ionic bombardment, the vertical etch rate would be much faster than the lateral etch rate and isotrophy would be lost. There would not be a resist pull back that we desire. In the process of the present invention, with the wafer in the lower chamber 52, the ions and electrons are short-lived through recombination. They do not reach the wafer sitting in the downstream chamber. Only non-ionic radicals and neutrals reach the wafer. With the absence of ions, the directionality effect through ionic bombardment is removed resulting in a pure isotropic etch for the critical resist pull back step.

Figure 4:
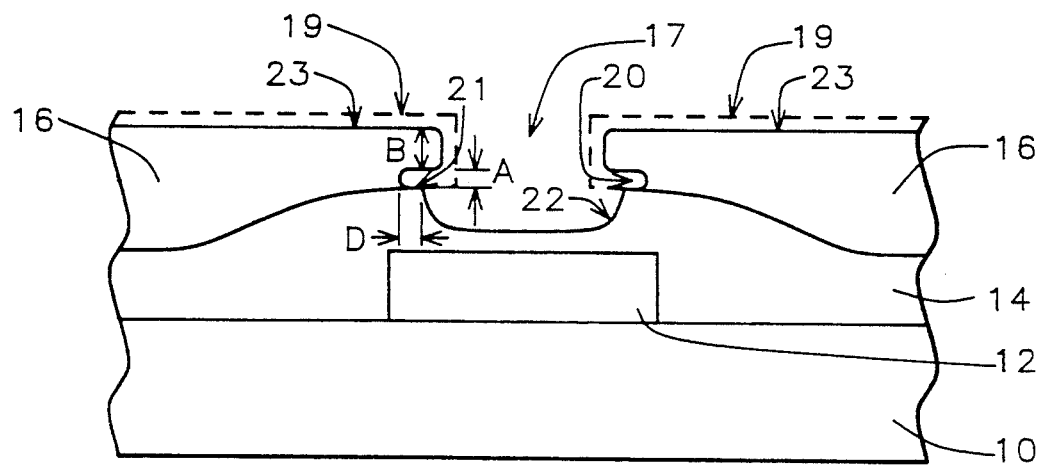

Referring now to FIG. 4, there is illustrated the resist pullback. Since the resist is etched three,-dimensionally, an overhang resist profile 20 is formed at the contact or via opening. Broken line 19 represents the original photoresist border. Line 23 illustrates the new resist border following the resist pullback step. The resist pull back is up to 0.3 micrometers per side. The resist is eroded from the bottom of the resist. The effect of this is to reduce the thickness in the overhang created so that this thinner resist can be totally and gradually etched away during the subsequent anisotropic etch. The isotropic etch step is ended in the BPSG layer 14 after about 3000 to 4000 Angstroms.

In the illustration of FIG. 4, the oxide layer 14 is between about 5000 to 7000 Angstroms thick and the resist layer 16 is about 12,000 Angstroms thick. During the pure isotropic pull back, the undercut A is about 3000 Angstroms, and the remaining overhang B is about 6000 Angstroms thick. Because of the pull back, oxide step 21 is formed. The recess D is between about 1500 to 2000 Angstroms. This will enhance the tapered profile during the anisotropic etch step.

Figure 5:
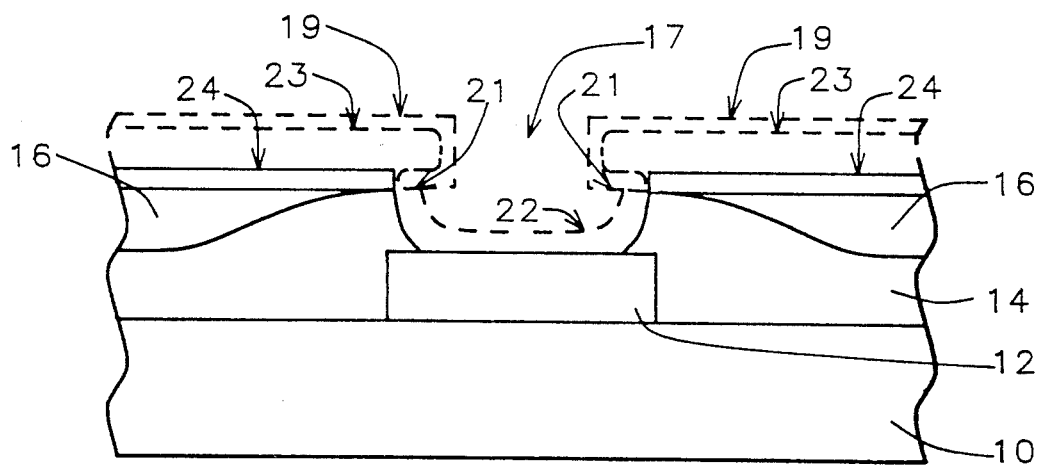

The final step of the process is a conventional anisotropic etch. For example, in a LAM 4500 oxide etcher, gases $CF_4$, $CHF_3$, and Ar are flowed at 25, 35, and 300 sccm, respectively. Power is 800 watts, pressure is maintained at 775 mtorr, and the gap between the electrodes is set at 0.9 cm. The overhang part of the resist 20 is recessed back gradually during etching, exposing the oxide step 21 created by the first isotropic etch. As shown in FIG. 5, as the etching proceeds, the oxide step 21 in FIG. 4 is exposed to the plasma etchant and is smoothed into a slope. Notice that the original resist border 19 that was replaced by border 23 after the resist pullback step has been replaced by border 24 as the resist has been eroded further by the anisotropic etching.

The anisotropic etch is actually performed in two steps. The first step is performed with low selectivity to the resist of about 2:1 to 3:1. This step is to continuously erode the resist back and to stop before etching into the underlying layer. The second step is performed with high selectivity to the resist of about 5:1 to 6:1. This will minimize the underlying layer loss.

Figure 6:
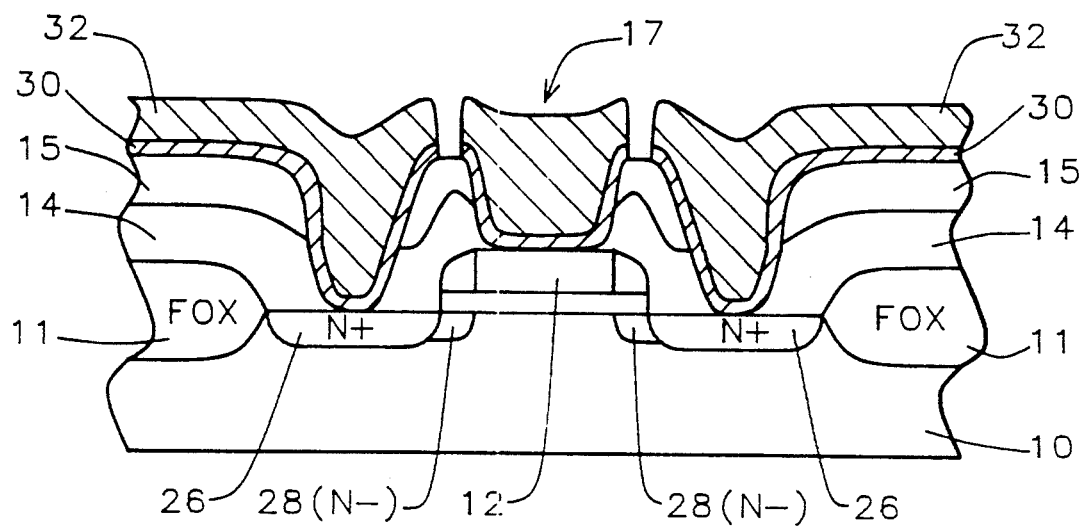

FIG. 6 illustrates a portion of a partially completed integrated circuit. Field oxide regions 11 have been formed within the silicon substrate 10. Diffusion regions 26 and 28 have been formed within the substrate 10. 14 is a layer of oxide and 15 is borophosphosilicate glass. Contact opening 17 above gate 12 is that opening illustrated in FIGS. 2 through 5. The electrical contact has been completed by the deposition of barrier metal layer 30, which may be composed of, for example, TiW, and metal layer 32, which may be, for example, aluminum. Note that a smooth tapered opening has been achieved. The metal layer 32 is then patterned as desired to continue fabrication of the integrated circuit.

Figure 7:
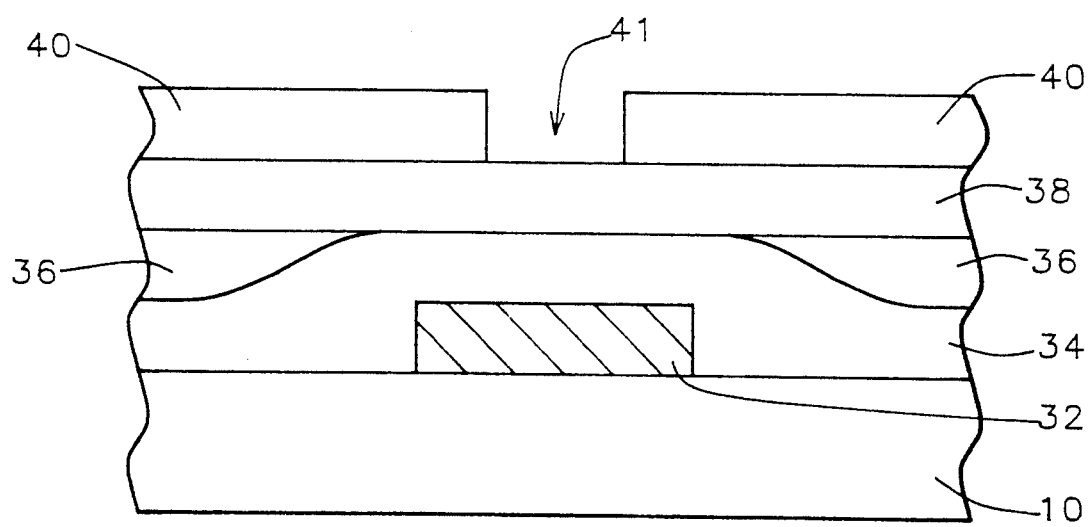
FIGS. 7 through 10 schematically illustrate in cross-sectional representation one preferred embodiment of this invention for a via opening.

FIG. 7 illustrates another portion of a partially completed integrated circuit in which there is a via opening to a metal layer 32. Overlying the metal layer is an insulating oxide layer 34. There may be a spin-on-glass layer 36 for planarization and there is a second oxide layer 38. Photoresist layer 40 is formed on top of oxide layer 38 as is conventional in the art to provide opening 41.

Figure 8:
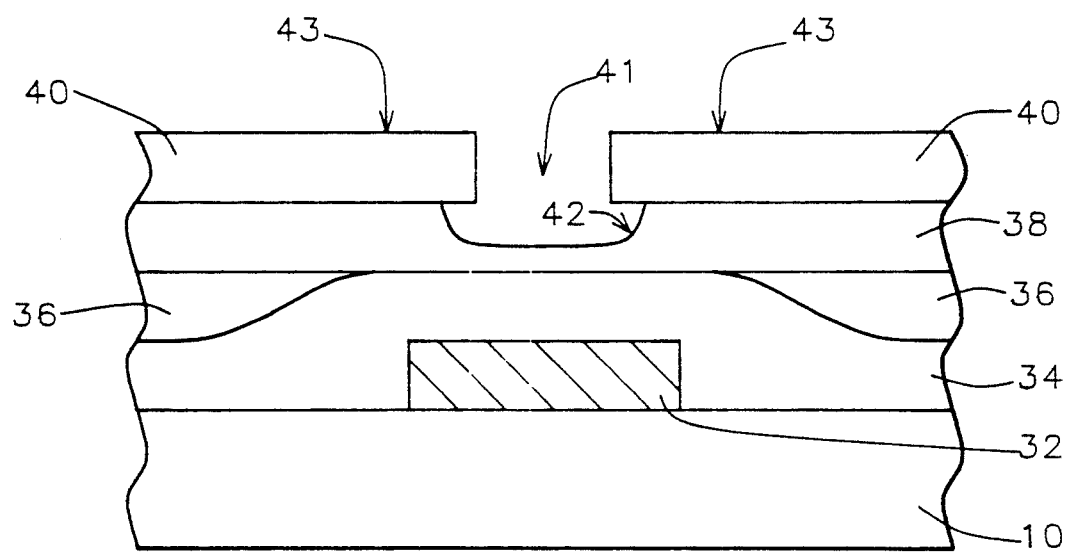

The process of the invention is the same for a via opening as that described above for a contact opening. An isotropic etch is performed which will etch both horizontally and vertically the layer 38, undercutting the photoresist layer 40 as shown in FIG. 8. The sidewalls 42 of the etched out opening are smooth tapered surfaces. For the via etch, the isotropic etch must end in the oxide layer 38. The isotropic etch must not continue into the spin-on-glass layer 36 because spin-on-glass will etch must faster than the oxide which would create an undesirable lateral undercut.

Figure 9:
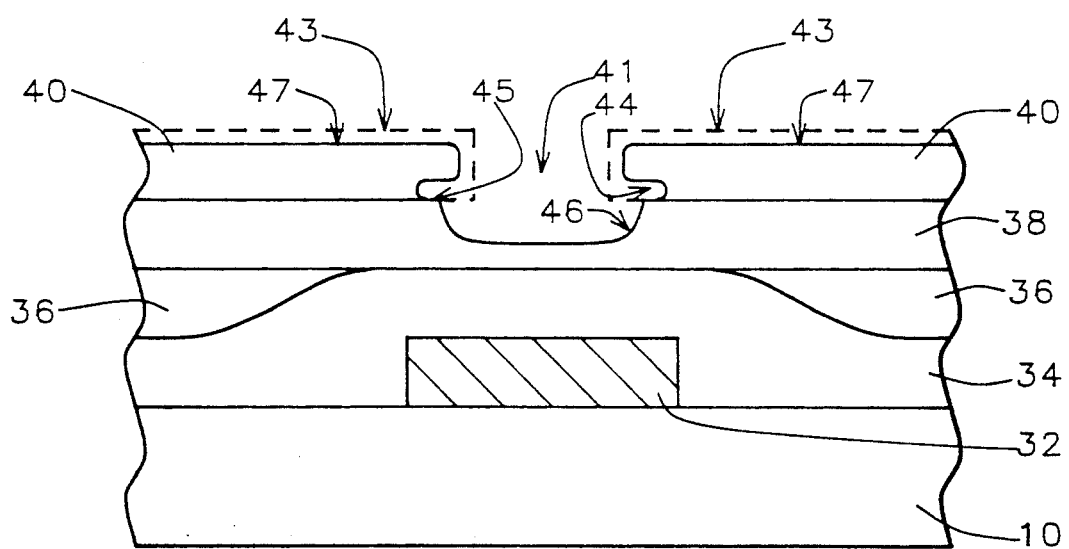

The second step, the critical resist pullback step, is performed in a downstream etcher as described above and illustrated in FIG. 12. Referring now to FIG. 9, there is illustrated the resist pullback. Since the resist is etched three-dimensionally, an overhang resist profile 44 is formed at the contact or via opening. Broken line 43 represents the original photoresist border. Line 47 illustrates the new resist border following the resist pullback step. The resist pull back is up to 0.3 micrometers per side. The resist is eroded from the bottom of the resist. The effect of this is to reduce the thickness in the overhang created so that this thinner resist can be totally and gradually etched away during the subsequent anisotropic etch.

Figure 10:
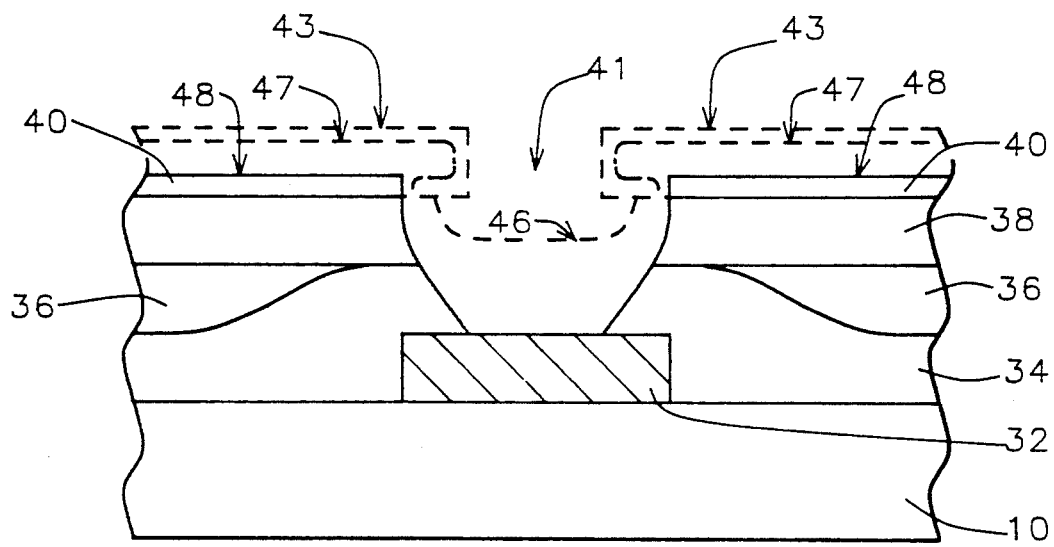

The final step of the process is a conventional anisotropic etch, as described above. The overhang part of the resist 44 is recessed back gradually during etching, exposing the oxide step 45 created by the first isotropic etch. As shown in FIG. 10, as the etching proceeds, the oxide step 45 in FIG. 9 is exposed to the plasma etchant and is smoothed into a slope. Notice that the original resist border 43 that was replaced by border 47 after the resist pullback step has been replaced by border 48 as the resist has been eroded further by the anisotropic etching.

Figure 11:
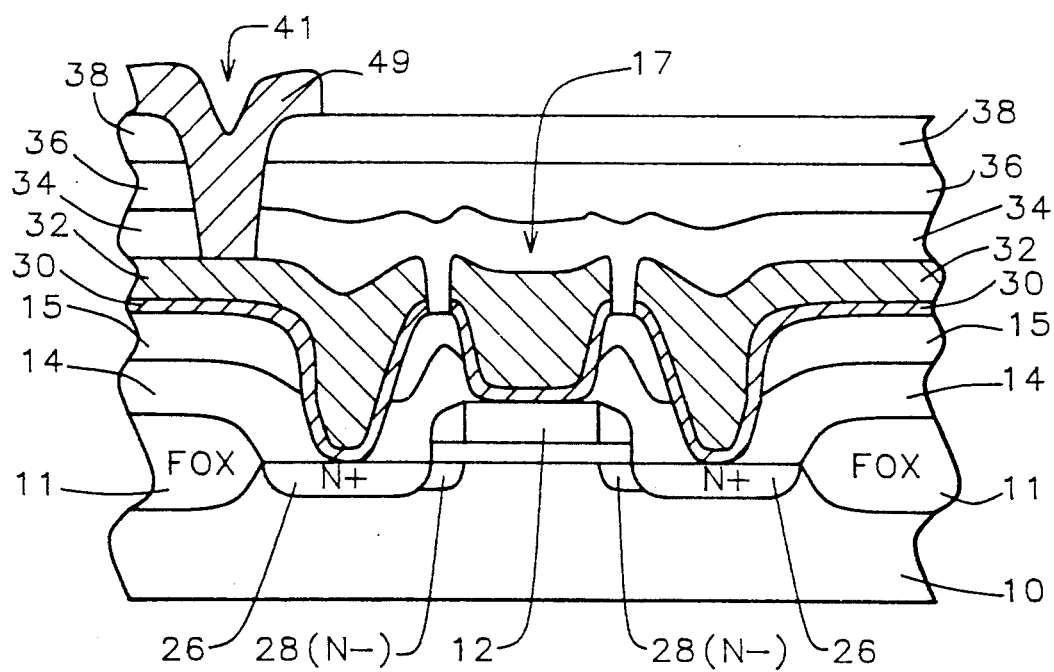
FIG. 11 schematically illustrates in cross-sectional representation both contact and via openings.

FIG. 11 illustrates the same portion of a partially completed integrated circuit as shown in FIG. 6. Intermetal dielectric layers 34 and 38 and spin-on-glass layer 36 have been added. Via opening 41 above metal layer 2 is that opening illustrated in FIGS. 7 through 10. Note that a smooth tapered opening has been achieved in this case as well. The completed via opening, or electrical contact, is filled with a metal 49, such as aluminum, which is then patterned as is conventional in the art to continue fabrication of the desired integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming a tapered opening in an insulating layer comprising:
   providing said insulating layer on a semiconductor substrate;
   forming and patterning a photoresist layer on top of said insulating layer with openings in said photoresist layer where the desired said tapered opening is to be located;

isotropically etching through said openings a portion of said insulating layer vertically and horizontally;

pulling back said photoresist layer via a pure isotropic etch wherein said photoresist layer is eroded from the portion of said photoresist layer in contact with said insulating layer forming an overhang photoresist profile and leaving a step at the top of said insulating layer underneath said overhand photoresist profile;

anisotropically etching remainder of said opening through said insulating layer wherein said overhang photoresist profile is etched away exposing said insulating layer step which is smoothed into said tapered opening having positive sloped sidewalls; and wherein said anisotropic etch is performed using a first step with low selectivity of said photoresist to said insulating layer of between about 2:1 to 3:1 and followed by a second step using higher selectivity of said photoresist to said insulating layer.

2. The method of claim 1 wherein said tapered opening is an electrical contact opening of less than about 0.8 micrometers and said first isotropic etch proceeds for about 3000 to 4000 Angstroms.

3. The method of claim 1 wherein said isotropic etch is a dry etch using $NF_3$ gas as the active ingredient.

4. The method of claim 1 wherein said pure isotropic etch is performed in a downstream etcher using oxygen gas.

5. The method of claim 1 wherein said pure isotopic etch is performed in a downstream etcher at a pressure of between 500 to 1000 mTorr using oxygen gas flowing at 20 to 40 sccm.

6. The method of claim 1 wherein said pure isotropic etch is performed in a downstream etcher with power of 30 to 60 watts at a pressure of 500 to 1000 mTorr using oxygen gas flowing at 20 to 40 sccm.

7. The method of forming an electrical contact to an integrated circuit device structure comprising:

providing an insulating layer overlying said integrated circuit device structure;

forming and patterning a photoresist layer on top of said insulating layer with openings in said photoresist layer where the desired said tapered opening is to be located;

isotropically etching through said openings a portion of said insulating layer vertically and horizontally;

pulling back said photoresist layer via a pure isotropic etch wherein said photoresist layer is eroded from the portion of said photoresist layer in contact with said insulating layer forming an overhang photoresist profile and leaving a step at the top of said insulating layer underneath said overhang photoresist profile;

anisotropically etching remainder of said opening through said insulating layer wherein said overhang photoresist profile is etched away exposing said insulating layer step which is smoothed into said tapered opening having positive sloped sidewalls;

wherein said anisotropic etch is performed using a first step with low selectivity of said photoresist to said insulating layer of between about 2:1 to 3:1 and followed by a second step using higher selectivity of said photoresist to said insulating layer; and completing said contact to said integrated circuit device structure by filling said electrical contact opening with metallurgy.

8. The method of claim 7 wherein said device structure is a source/drain region within a semiconductor structure.

9. The method of claim 7 wherein said device structure is a conductive layer.

10. The method of claim 7 wherein said isotropic etch is a dry etch using $NF_3$ gas as the active ingredient.

11. The method of claim 7 wherein said pure isotropic etch is performed in a downstream etcher with power of 30 to 60 watts at a pressure of 500 to 1000 mTorr using oxygen gas flowing at 20 to 40 sccm.

12. The method of forming an electrical contact through an oxide/spin-on-glass/oxide sandwich layer to the underlying metallurgy layer of an integrated circuit comprising:

forming and patterning a photoresist layer on top of said sandwich layer to leave openings in the photoresist layer at the locations of the desired said electrical contact;

isotropically etching a portion of said sandwich layer vertically and horizontally through said photoresist layer openings and stopping said etching before said spin-on-glass portion of said sandwich layer is reached;

pulling back said photoresist layer by a pure isotropic etch wherein said photoresist layer is eroded from the portion of said photoresist layer in contact with said insulating layer forming an overhang photoresist profile and leaving a step at the top of said sandwich layer underneath said overhang photoresist profile;

anisotropically etching remainder of said electrical contact opening through said sandwich layer wherein said overhang photoresist profile is etched away exposing said sandwich layer step which is smoothed into said tapered opening having positive sloped sidewalls;

wherein said anisotropic etch is performed using a first step with low selectivity of said photoresist to said insulating layer of between about 2:1 to 3:1 and followed by a second step using higher selectivity of said photoresist to said insulating layer; and completing said electrical contact to said metallurgy layer by filling said electrical contact opening with a second metallurgy.

13. The method of claim 12 wherein said isotropic etch is a dry etch using $NF_3$ gas as the active ingredient.

14. The method of claim 12 wherein said pure isotropic etch is performed in a downstream etcher with power of 30 to 60 watts at a pressure of 500 to 1000 mTorr using oxygen gas flowing at 20 to 40 sccm.

15. The method of claim 14 wherein said pure isotropic etch produces a photoresist pullback is up to 0.3 micrometers on each side of said electrical contact opening.

* * * * *